(12) United States Patent
Kilgore et al.

(10) Patent No.: US 6,200,412 B1
(45) Date of Patent: Mar. 13, 2001

(54) CHEMICAL VAPOR DEPOSITION SYSTEM INCLUDING DEDICATED CLEANING GAS INJECTION

(75) Inventors: Michael D. Kilgore, Santa Clara; Wilbert G. M. van den Hoek, Cupertino; Christopher J. Rau, Milpitas; Bart J. van Schravendijk, Sunnyvale; Jeffrey A. Tobin, Mountain View; Thomas W. Mountsier, San Jose; James C. Oswalt, Pleasanton, all of CA (US)

(73) Assignee: Novellus Systems, Inc., San Jose, CA (US)

( * ) Notice: Subject to any disclaimer, the term of this patent is extended or adjusted under 35 U.S.C. 154(b) by 0 days.

(21) Appl. No.: 08/602,641

(22) Filed: Feb. 16, 1996

(51) Int. Cl.[7] .............................. B65C 3/26; C23C 16/00; H01L 21/00
(52) U.S. Cl. ..................... 156/345; 118/715; 118/728; 438/800
(58) Field of Search ................................ 118/715, 728; 438/800; 156/345

(56) References Cited

U.S. PATENT DOCUMENTS

| | | | |
|---|---|---|---|
| 4,033,286 | 7/1977 | Chern et al. | 118/49 |
| 4,512,283 | 4/1985 | Bonifield et al. | 118/723 |
| 4,576,698 | 3/1986 | Gallagher et al. | 204/192 |
| 4,657,616 | 4/1987 | Benzing et al. | 156/345 |
| 5,129,958 | 7/1992 | Nagashima et al. | 134/22.1 |
| 5,211,796 | * 5/1993 | Hansen | 156/345 |
| 5,264,040 | * 11/1993 | Geyling | 118/728 |
| 5,273,588 | 12/1993 | Foster et al. | 118/723 |
| 5,413,670 | 5/1995 | Langan et al. | 134/1.2 |
| 5,454,903 | * 10/1995 | Redeker et al. | 216/67 |
| 5,571,366 | 11/1996 | Ishii et al. | 156/345 |
| 5,679,215 | * 10/1997 | Barnes et al. | 156/646.1 |

FOREIGN PATENT DOCUMENTS

| | | | |
|---|---|---|---|
| 0 680 072 A2 | 4/1995 | (EP) . | |
| 0 692 550 A1 | 6/1995 | (EP) . | |
| 685873 | * 12/1995 | (EP) | H01J/37/32 |
| 0 685 873A1 | 12/1995 | (EP) | H01J/37/32 |
| 1-298181 | 12/1989 | (JP) . | |
| 3-243774 | 10/1991 | (JP) . | |
| 7-312348 | 11/1995 | (JP) . | |

OTHER PUBLICATIONS

Dr. W.G.M. van den Hoek et al., "A New High Density Plasma Source for Void Free Dielectric Gap Fill", Technical Proceedings, Semi Technology Symposium, Nov. 30—Dec. 2, 1994, Tokyo, Japan.

* cited by examiner

*Primary Examiner*—Lynette R. F. Smith
*Assistant Examiner*—V. Ryan
(74) *Attorney, Agent, or Firm*—Skjerven Morrill MacPherson LLP; Roberta P. Saxon

(57) ABSTRACT

A plasma-enhanced chemical vapor deposition system includes a number of process gas injection tubes and at least one dedicated clean gas injection tube. A plasma is used to periodically clean the interior surfaces of the deposition chamber. The cleaning is made more rapid and effective by introducing the clean gas through the dedicated clean gas injection tube. In this manner the clean gas can be introduced at a relatively high flow rate without detracting from the cleaning of the interior surfaces of the process gas injection tubes. As a separate aspect of this invention, a high-frequency signal is applied to both terminals of the coil during the cleaning process. This produces a plasma, mainly by capacitive coupling, which has a shape and uniformity that are well-suited to cleaning the surfaces of the deposition chamber.

16 Claims, 6 Drawing Sheets

CHEMICAL VAPOR DEPOSITION SYSTEM INCLUDING DEDICATED CLEANING GAS INJECTION

CROSS REFERENCE TO RELATED APPLICATION

This application is related to application Ser. No. 07/971,363, filed Nov. 4, 1992, now U.S. Pat. No. 5,346,578, issued Sep. 13, 1994, and to application Ser. No. 08/602,432 filed Feb. 18, 1996, now U.S. Pat. No. 5,810,933, issued Sep. 22, 1998, filed contemporaneously herewith, each of which is incorporated herein by reference in its entirety.

FIELD OF THE INVENTION

This invention relates to chemical vapor deposition (CVD) systems and in particular to arrangements for cleaning high-density-plasma CVD systems.

BACKGROUND OF THE INVENTION

Plasma-assisted chemical vapor deposition systems are used to grow thin films on silicon wafers and other substrates. In the course of growing the film on the wafer or other substrate, the film is also deposited on other locations in the reaction chamber. Periodically, these deposits must be removed to prevent them from building up to the point where particulates are generated. Particulates can, for example, reduce microelectronic device yield, since a die on which a particle has landed during processing must normally be discarded.

It is known to remove film build-up with liquid etchants, vapor etchants and plasma etchants. Of these methods, plasma etching is favored because it provides superior cleaning rates and can be performed without exposing the reaction chamber to the atmosphere. These characteristics are required for high deposition system productivity. If the reaction chamber is being used to deposit a $SiO_2$ film, for example, $NF_3$ can be used as a clean gas. The $NF_3$ plasma creates fluorine radicals which react with the $SiO_2$ film under the influence of ion bombardment to form $SiF_4$ and other volatile compounds.

The process gas is injected into the reaction chamber through a process gas injection system, which may include a plurality of tubes. The deposition gas tubes may be directed radially inward from the periphery of the reaction chamber, although other orientations of the tubes are possible. During the deposition process an unwanted film of the deposition material forms on the inner surfaces of the deposition gas tubes. This film must be removed during cleaning.

The conventional practice is to inject the clean gas through the same tubes that were used to introduce the process gas. A problem with this technique is that it has been found to be a very inefficient way of removing the film which forms on the insides of the deposition gas tubes.

Thus there is a clear need for a way of effectively cleaning the deposition gas injection tubes of a plasma-enhanced CVD system.

Fluorine-bearing compounds are frequently used as the clean gas. Following the clean cycle, a fluorine residue remains on the walls and other surfaces of the reaction chamber. The fluorine residue must be removed for safety reasons and to insure that the film adheres to the reaction chamber surfaces in the subsequent deposition cycle. U.S. Pat. No. 5,129,958 describes the use of a reducing gas to remove the fluorine residues, but this process requires the use of elevated reaction chamber temperature, which is difficult for many systems, and therefore takes an undue amount of time.

SUMMARY OF THE INVENTION

A plasma-enhanced chemical vapor deposition system according to this invention includes at least one dedicated clean gas injection orifice or tube. The dedicated orifice or tube is placed at a location where minimal deposition occurs during the operation of the CVD system. In the preferred embodiment, the process gas is injected into the reaction chamber through a plurality of tubes. The dedicated clean gas injection orifice or tube is located between the wafer supporting chuck or platen and the outer wall of the reaction chamber, and at level approximately equal to the level of the wafer supporting chuck or platen when a wafer is being processed in the reaction chamber. This position is chosen to minimize deposition on the clean injector, minimize particle generation from the clean injector, and maintain the ability to effectively clean surfaces near the clean injector. The dedicated clean gas injection orifice or tube is also positioned so that it directs the clean gas to the film-coated surfaces of the reaction chamber before the clean gas reaches the exhaust pump port.

In the preferred embodiment, during deposition processing a hemispherically-shaped coil is used to inductively couple energy to the plasma. The top of the coil is typically connected to a power source while the bottom of the coil (the circumferential turn of the hemisphere) is grounded. In accordance with another aspect of the invention, during cleaning both the top and bottom of the coil are driven by a power source, and the coil as a whole acts to couple energy, mainly capacitively, into the plasma. Also, typically the coil is operated at a significantly higher frequency during the cleaning cycle than during processing. With these modifications, the coil produces a plasma which is particular well suited to cleaning the inside surfaces of the reaction chamber.

The geometry of the coil is such that electrical self-resonances occur at the higher frequencies. It is believed that this property of the coil makes this electrical configuration robust for powering cleaning plasmas of varying compositions and, therefore, varying electrical characteristics.

In accordance with yet another aspect of the invention, a plasma of hydrogen or a hydrogen-oxygen mixture is used to remove fluorine-bearing residues from the surfaces of the reaction chamber following the clean cycle. The use of the plasma makes the fluorine removal possible at low temperatures (25°–100° C.).

DESCRIPTION OF THE INVENTION

Figure 1:
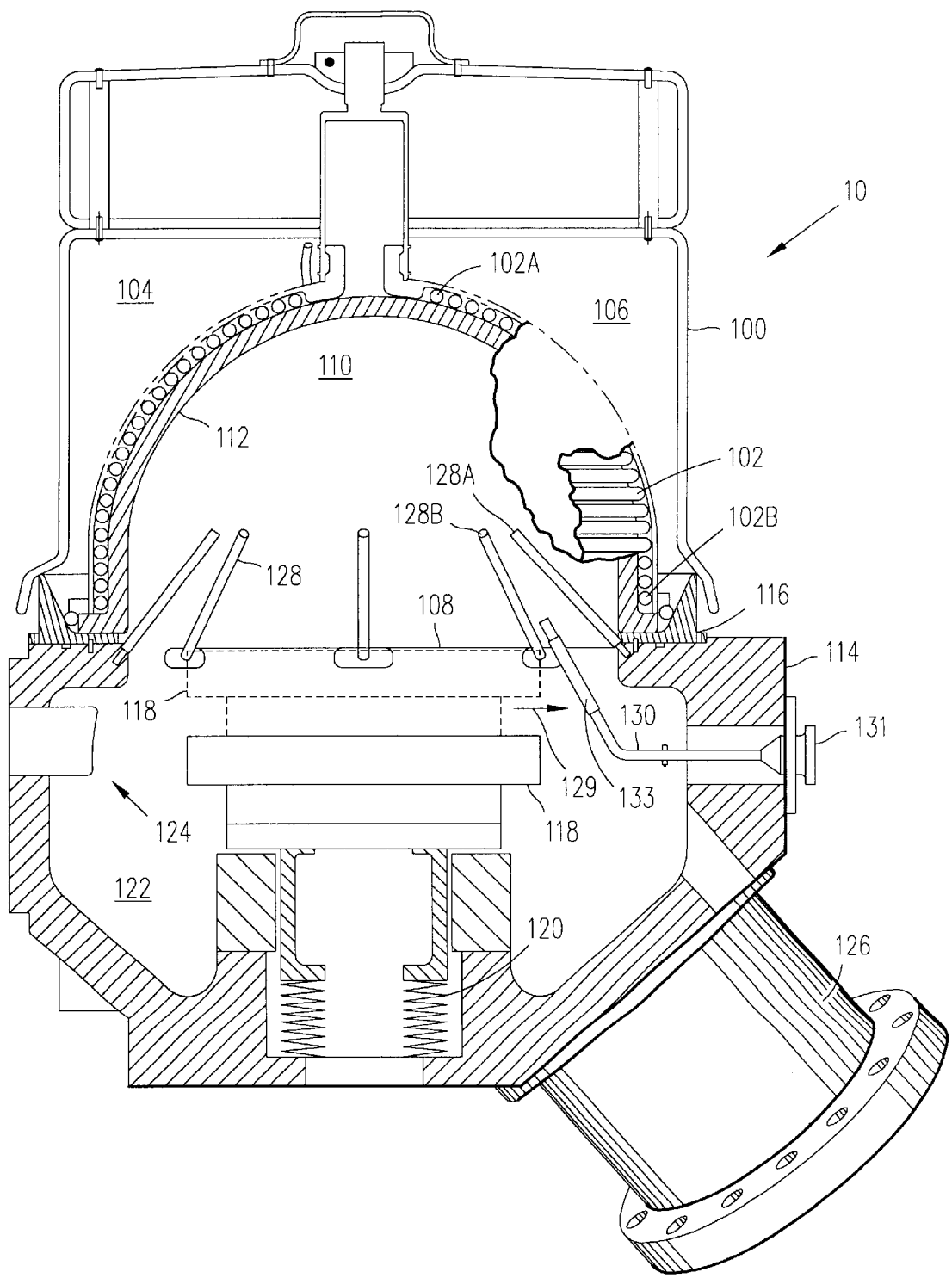
FIG. 1 is a cross-sectional view of a high-density-plasma chemical vapor deposition (HDP-CVD) system in accordance with this invention.
Figure 2:
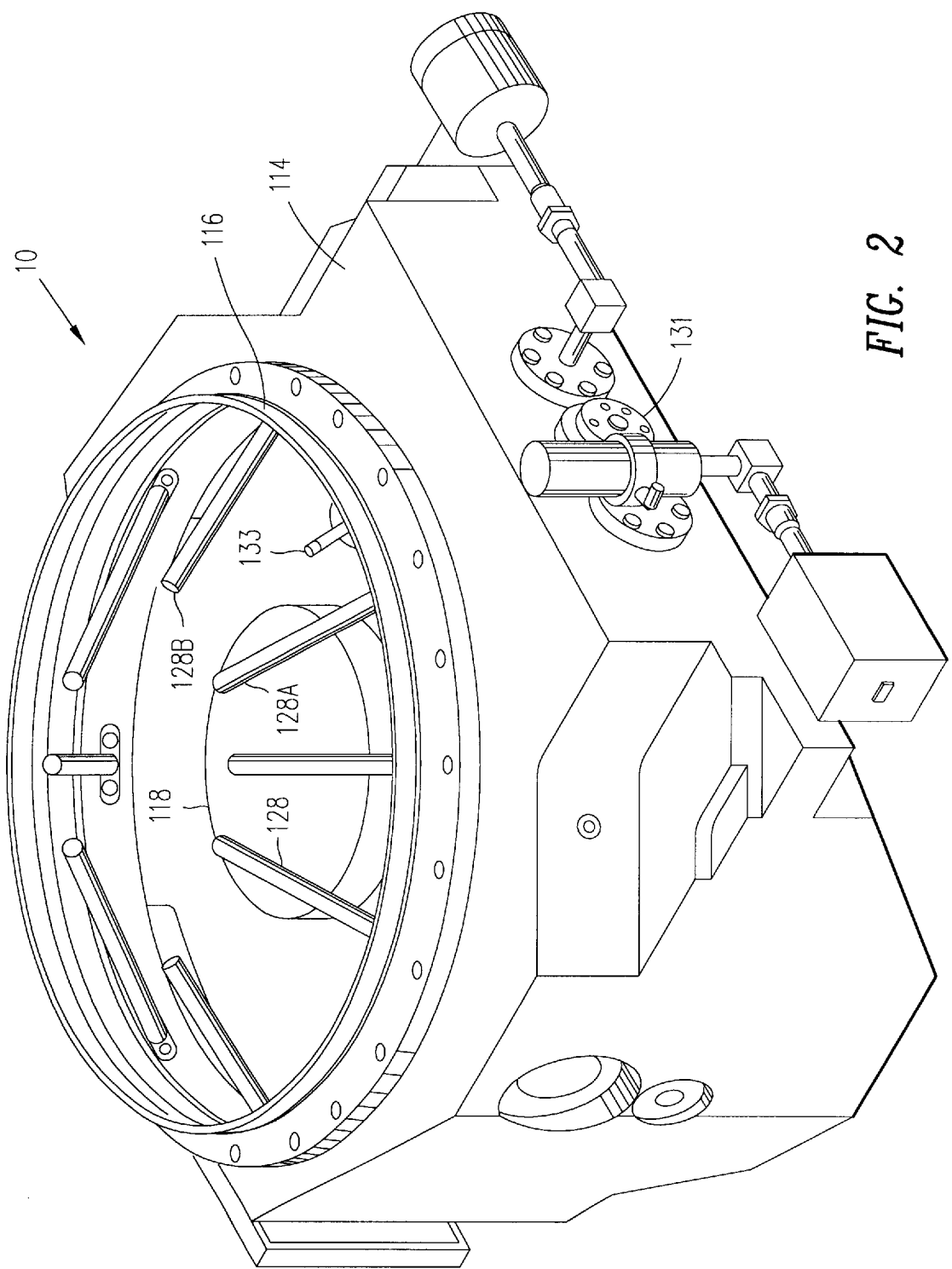
FIG. 2 is a perspective view of the lower portion of the HDP-CVD system shown in FIG. 1.

An HDP-CVD system 10 is shown in cross-sectional view in FIG. 1. A perspective view of the lower portion of HDP-CVD system 10 is shown in FIG. 2. HDP-CVD system 10 includes an aluminum housing 100 and a hemispherical induction coil 102 that is provided in an expanding spiral pattern on six winding forms—only forms 104 and 106 are illustrated for clarity. Six forms are used to simplify assembly of the induction coil 102, although other form types such as a unitary form are suitable as well, depending on the manufacturing techniques employed. The winding forms, e.g. forms 104 and 106, are made of any suitable material, which include dielectric materials such as nylon. The induction coil 102 is held in place inside channels in the winding forms, e.g. 104 and 106, by any suitable dielectric strapping, adhesive, or cement. Although induction coil 102 is a nearly complete hemisphere in FIG. 1, alternatively the induction coil could be in the shape of a partial or truncated hemisphere.

The induction coil 102 is made of copper tubing having an inner diameter of 3.6 mm and an outer diameter of 6.4 mm. The expanding spiral pattern of the induction coil 102 has 21 windings. The first winding is nearly coplanar with a semiconductor wafer 108, which is shown in position for processing.

During processing operations, the induction coil 102 is positioned around a reaction chamber 110 which is formed by an aluminum oxide ($Al_2O_3$) vessel or bell jar 112 in conjunction with an aluminum top plate 114. Preferably, the vessel 112 is hemispherically shaped so that there is a balanced coupling of rf (uniform dielectric spacing) into the vacuum cavity. Generally, the vessel material is an insulating dielectric having sufficient structural integrity to withstand a vacuum. Besides aluminum oxide, suitable materials include quartz, pyrex, polyamide, and other oxide or nitride composites. The induction coil 102 follows the hemispherical contour of the vessel 112, which is capable of holding a vacuum and contains the substrate, illustratively a semiconductor wafer containing integrated circuit chips in fabrication.

The housing 100 is mounted onto the top plate 114 in any convenient manner. FIG. 1 shows the housing 100 as being engaged by an rf seal 116, which includes copper leaves to prevent spurious rf emissions from the HDP-CVD system 10.

Wafer 108, illustratively 200 mm in diameter, is supported within the reaction chamber 110, preferably by an electrostatic chuck of the kind described in the above-referenced application Ser. No. which includes a platen 118.

The platen 118 is capable of vertical motion, which is imparted by any suitable mechanism (not shown). The position of the platen depends on whether the HDP-CVD system 10 is operating in process mode or in wafer transfer mode. The position of platen 118 in the process mode is shown in dashed lines; its position in the wafer transfer mode is shown in solid lines. Bellows 120, which is provided to isolate the mechanical components of the pedestal drive system at atmospheric pressure from the vacuum in reaction chamber 110, is extended. The wafer then rests on the platen 118 within the reaction chamber 110.

For wafer unloading and loading, the platen 118 is lowered into a wafer transfer region 122, which includes at one end a sealable wafer transfer opening 124. The bellows 120 is compressed, and three lifter pins (not shown) protrude through holes (not shown) in the platen 118 so as to support the wafer in a stationary position within the transfer region 122 as the platen 118 lowers. The sealable wafer transfer opening 124 is provided to permit a wafer transport arm (not shown) access to the transfer region 122 during wafer transfer mode. Suitable wafer transport arms and associated mechanisms are well known in the art. A vacuum pumping system (not shown) of any suitable type is connected to the transfer region 122 through a vacuum pump port 126 for evacuating the reaction chamber 110. Suitable vacuum pumping systems are well known in the art.

A plurality of process gas injection tubes 128 are arrayed around the periphery of the reaction chamber 110. Tubes 128 are arranged radially and are directed inwardly and upwardly towards the top of the hemispherical vessel 112. The openings of the tubes 128 are positioned somewhat above the level of the wafer 108 when it is in position for processing. Tubes 128 are connected in a known manner to lines which supply process gases to the interior of reaction chamber 110. The configuration of process gas injection tubes 128 shown in FIGS. 1 and 2 is determined by the particular processes that are to be performed by HDP-CVD system 10 and by the way in which the process gas is to be distributed over the wafer. The embodiment shown is one possible process gas injection tube configuration for using silane, $O_2$ and Ar to deposit a film of $SiO_2$. In other embodiments, the process gas injection tubes could be of a different length from the process gas tubes 128, or they could be oriented parallel to the wafer or pointed downward.

Separate from the process gas injection tubes 128 is a clean gas injector 129, which includes a clean gas injection tube 130 which is made of aluminum and extends from a clean gas fitting 131 at the side of system 10. While clean gas injection tube 130 appears as if it lies in a single vertical plane in FIG. 1, FIG. 2 shows that clean gas injection tube 130 actually bends around backwards so that it approaches platen 118 between the process gas injection tubes labeled 128A and 128B in FIGS. 1 and 2.

Clean gas injector 129 also includes a ceramic ($Al_2O_3$) sleeve 133 surrounding a portion of clean gas injection tube 130 to prevent the plasma from attacking the aluminum. The tip of ceramic sleeve 133, which forms the outlet of the clean gas injector 129, is located just above the level of the wafer 108 when it is in position for processing, but in other embodiments the outlet of the clean gas injector could be located at a somewhat higher or lower level. Clean gas injector 129 is directed upward and towards the highest point within reaction chamber 110. The outlet of the clean gas injector should be located radially outside the periphery of the wafer.

Process gas injection tubes 128 typically are exposed to the plasma. As a result, when a wafer is being processed deposition normally occurs on the exterior and interior surfaces of the tubes 128. The conventional practice is to introduce the clean gas through tubes 128. For example, if $SiO_2$ is being deposited, $NF_3$ may be used as a clean gas. The $NF_3$ produces fluorine radicals which react with $SiO_2$ under simultaneous ion bombardment to form $SiF_4$ and other volatile compounds and thereby remove the unwanted $SiO_2$ film. Physically, however, the flow of the clean gas through process gas injection tubes 128 inhibits the ability of the clean gas (in this case the fluorine radicals) to reach the interior surfaces of the process gas injection tubes 128, and therefore the cleaning process is very inefficient in these locations. It has been found that, using this technique, the tubes can be cleaned only by introducing the clean gas at a very low flow rate, and even then the cleaning takes place very slowly. At higher flow rates, the tubes may not be cleaned at all.

Introducing the clean gas through the separate clean gas injector 129 solves this problem. The interior of the clean gas injection tube should remain as clean as possible during deposition processing and therefore the clean gas injector 129 is preferably positioned at a location where minimal deposition occurs during the deposition processing cycle of the system 10. This would normally be at or below the level of the wafer during processing, but there may be other regions in the reaction chamber where the clean gas injection tube can be located. To insure that the clean gas reaches the film-covered surfaces, the dedicated clean gas injector is positioned so that it directs the clean gas to the surfaces of the reaction chamber before reaching the exhaust pump port. Moreover, the clean gas injector should inject the clean gas at a point which is no closer than about 1 cm to surrounding surfaces. Surfaces which are less than about 1 cm from the point at which the clean gas is injected may not be effectively cleaned.

While the clean gas injector 129 shown in FIGS. 1 and 2 includes only one clean gas injection tube 130, other embodiments may include a plurality of clean gas injection tubes.

The hemispherical coil shown in FIGS. 1 and 2 is particularly useful in generating a high density plasma. High density plasmas (e.g., $10^{11}$–$10^{13}$ ions/cm$^3$) are used with low pressures (e.g., 0.1–100 mTorr) in situations where deposition and/or sputter etching are required. As described in the above-referenced U.S. Pat. No. 5,346,578, the coil is driven by connecting a low-frequency rf source (e.g., in the range of 450 kHz) to the upper terminal of the coil and connecting the lower terminal of the coil to ground.

While this arrangement provides a good plasma for the deposition processing cycle, it has been found that connecting both terminals of the coil to a relatively high-frequency rf source provides a better plasma for the clean cycle and can also be used for a deposition processing cycle.

Figure 3:
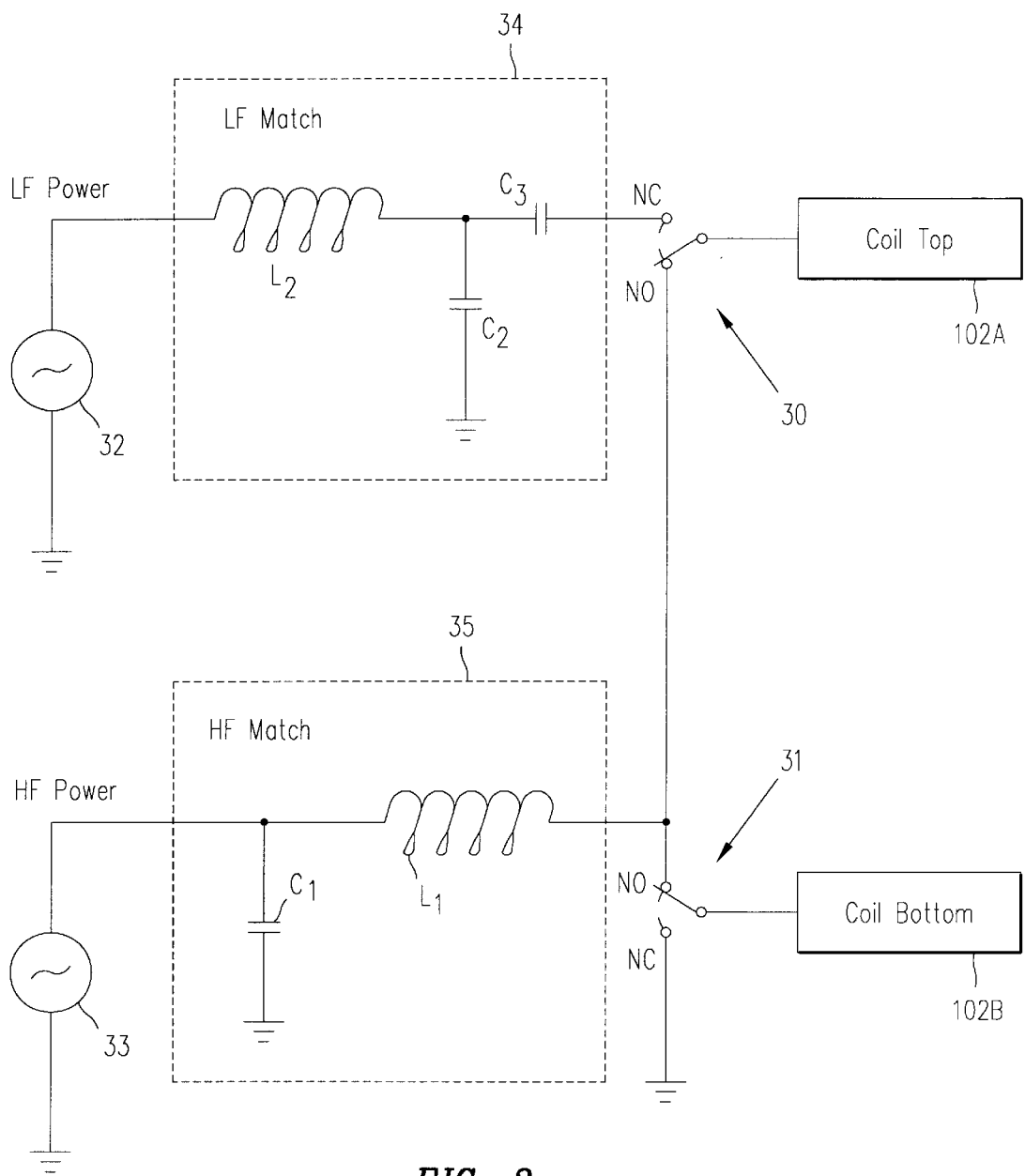
FIG. 3 is a schematic diagram of the electrical circuitry for supplying power to the coil in the HDP-CVD system shown in FIGS. 1 and 2.

Circuitry for driving the coil 102 is shown in FIG. 3. The upper terminal 102A and lower terminal 102B of coil 102 (see FIG. 1) are connected through vacuum relay switches 30 and 31 to a low-frequency rf source 32 and a high-frequency rf source 33. As described above, low-frequency source 32 delivers an output at 350–450 kHz; high-frequency source 33 delivers an output at 5–20 MHz and in this case at 13.56 MHz. The signal output of rf source 32 is fed through a low-frequency impedance matching network 34, containing an inductor L2 (7 $\mu$H) and capacitors C2 (12 nF) and C3 (4.0–5.7 nF), and the signal output of rf source 33 is fed through a high-frequency matching network 35, containing a inductor L1 (0.95 $\mu$H) and a capacitor C1 (200 pF). The values of capacitors C1–C3 and inductors L1–L2 may be varied.

Switches 30 and 31 are single pole, double-throw switches and are ganged together. During deposition processing, switches 30 and 31 are in the Normal Closed (NC) positions. Thus, as described above, the 450 kHz source 32 is connected to the upper terminal 102A of coil 102, and the lower terminal 102B of coil 102 is grounded. During cleaning, switches 30 and 31 are both in the Normal Open (NO) positions, and as a result the 13.56 MHz source is connected to both of the terminals 102A and 102B. In this condition, the coil 102 acts mainly through capacitive coupling to produce a plasma which is particularly suitable for cleaning the interior surfaces of reaction chamber 110.

Although in this embodiment the rf signal was introduced at the terminals of the coil, in other embodiments the rf signal could be introduced at two or more other locations on the coil, e.g., at one terminal and at the midpoint of the coil, with the other terminal left floating.

In another embodiment of this invention the high frequency power introduced at two or more locations on the coil can be used to create a high-density plasma, mainly by induction coupling. This plasma is suitable of deposition processing.

The clean gas is frequently a fluorine bearing compound such as $NF_3$, $C_2F_6$, $C_3F_8$, $SF_6$, or $CF_4$ (possibly with the addition of $O_2$, $H_2$ or inert gases) which as described above is activated in a glow discharge. The deposits are removed as volatile fluorides and oxygen. Following the clean, residual fluorine and fluorine compounds will remain adsorbed to the surfaces of the reaction chamber. If these residues are not removed, subsequent film deposits may not adhere to the surfaces of the reaction chamber, resulting in flaking and increased particulate generation. Also, operating personnel may be exposed to excessive fluorine levels if the reaction chamber is vented to the atmosphere and opened.

It has been found that these fluorine-bearing residues can be removed by means of a hydrogen plasma, which dissociates hydrogen molecules ($H_2$) into atomic hydrogen. The atomic hydrogen reacts with the fluorine residues to form HF, which is then pumped away through the exhaust system. Without the operation of a plasma, the hydrogen molecules will not react with the fluorine residues in this way in the moderate temperature range (25°–150° C.) at which it is desirable to maintain the reaction chamber components. At more elevated temperatures the design and construction of the reaction chamber components are much more difficult and expensive. The plasma is essential for dissociating the hydrogen (and oxygen), as well as for providing ion bombardment to enhance the surface reactions necessary to remove fluorine residues from surfaces at low temperature.

When the hydrogen plasma is initiated, the pressure in the reaction chamber pressure by a factor of 2–3 over the starting value (without the plasma). As the process continues, the pressure falls, eventually reaching the starting value. Following a eight-minute clean cycle, the process generally takes about two minutes. If the hydrogen is mixed with oxygen, the time required for the process is reduced by 33% to 50%.

The following are illustrative variables for the passivation process: The hydrogen can be introduced at a flow rate of 50–1000 sccm, with oxygen at a flow rate of 0–500 sccm. The starting pressure in the reaction chamber can be in the range 0.1–5 Torr. The coil can be energized with an rf signal having a frequency of 150 kHz to 13.56 Mhz at a power of 500–5000 W.

Comparative Test Results

Tests have been conducted to compare the effectiveness of a cleaning system according to this invention with conventional cleaning systems. The effective cleaning rate was defined as the total thickness of film deposited on wafers, using the system in the deposition mode, divided by the time required to subsequently clean the reaction chamber. A goal of the plasma clean is to remove film from the surfaces of the reaction chamber periodically so that this film does not flake off and cause high particle counts on wafers. A high cleaning rate is desirable to maximize the number of wafers per hour that the system can process.

In the tests, $NF_3$ was used as the clean gas to remove a $SiO_2$ film. The time required to clean the reaction chamber was monitored by optical emission spectroscopy (OES). With this technique, the intensity of light of a certain wavelength in the emission spectrum of fluorine is measured, the intensity being directly proportional to the concentration of fluorine radicals in the plasma. As noted above, the fluorine radicals are responsible for the removal of the SiO$_2$ film from the reaction chamber surfaces. At the beginning of the plasma clean, there is a great deal of film left to remove, and the available fluorine is rapidly consumed. Thus the optical emission intensity of fluorine is relatively low. As the clean continues, less film remains to react with the fluorine radicals, and as a result the fluorine concentration increases until, at the end of the clean, it reaches a steady value. The optical emission signal correspondingly reaches a steady value at the endpoint. Thus, for a given film thickness deposited on the wafers in the reaction chamber, the optical emission measurement provides an indication of the effective clean rate.

The effective clean rate, however, does not provide complete information about the effectiveness of the plasma clean. The endpoint of the optical emissions may occur without the film having been completely removed from all areas of the reaction chamber. In particular, if the clean gas is introduced through the process gas injection tubes, the film may not be entirely removed from the interior surfaces of the tubes. Therefore, to provide a complete test result, visual inspection of all reaction chamber surfaces was made to determine which cleaning method and conditions provide the best results. In addition, the stability and uniformity of the clean plasma were visually observed. Poor stability and uniformity of the plasma can lead to nonuniform removal of the film in different areas of the reaction chamber. In this case, the reaction chamber materials can suffer enhanced attack in areas the film removal rate is high, and this can lead to increased contamination of the wafers and the need for more frequent maintenance of the reaction chamber.

Three tests were conducted, the results of which are illustrated by the OES scans shown in FIGS. 4, 5A, 5B, 6A and 6B. The horizontal axis in each of these figures is the time (in seconds) from the beginning of the clean, and the vertical axis represents the level of the emission intensity (in arbitrary units).

Figure 4:
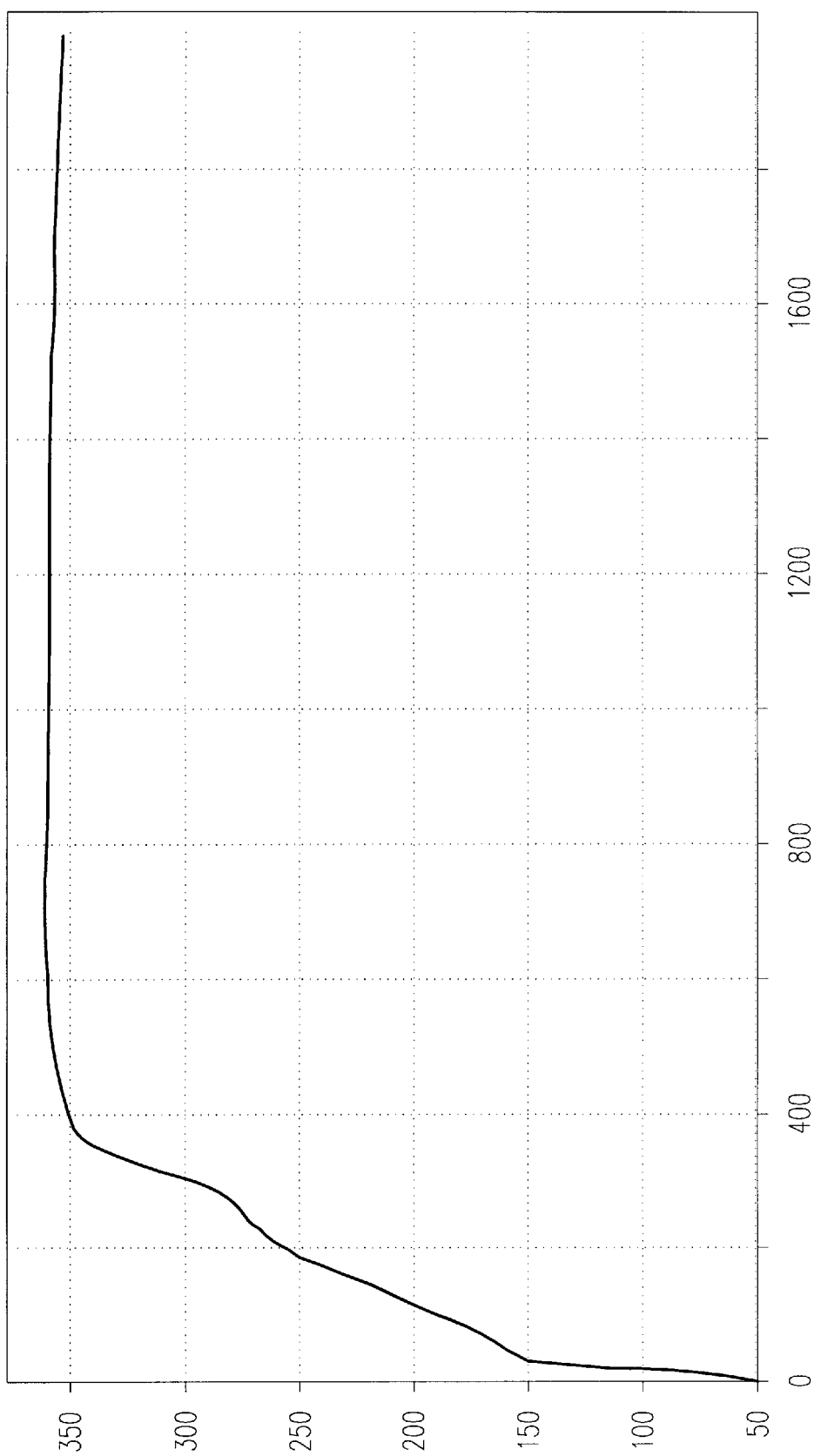
FIGS. 4, 5A, 5B, 6A and 6B are graphs showing optical emission spectroscopy (OES) scans which illustrate the results of a series of comparative tests between conventional cleaning processes and a cleaning process using a HDP-CVD system according to this invention.

In Test #1, the coil was energized at a low frequency (350–450 kHz) and 2 kw. The signal was applied to the upper terminal of the coil, and the lower terminal of the coil was grounded. FIG. 4 illustrates an OES scan of a clean cycle under these conditions with the NF$_3$ clean gas being introduced at 600 sccm and at a pressure of 1.6 Torr. A wavelength of 686 nm was measured. The effective cleaning rate of the plasma clean was fairly good (8000 A/min), and the clean was completed in about 400 seconds. The effective clean rate was not very meaningful, however, because not all surfaces of the reaction chamber (in particular the inside surfaces of the process gas injection tubes) were cleaned. Particle counts on wafers processed following the clean were unacceptable. Also, the plasma stability and uniformity were poor in Test #1.

Figure 5A:
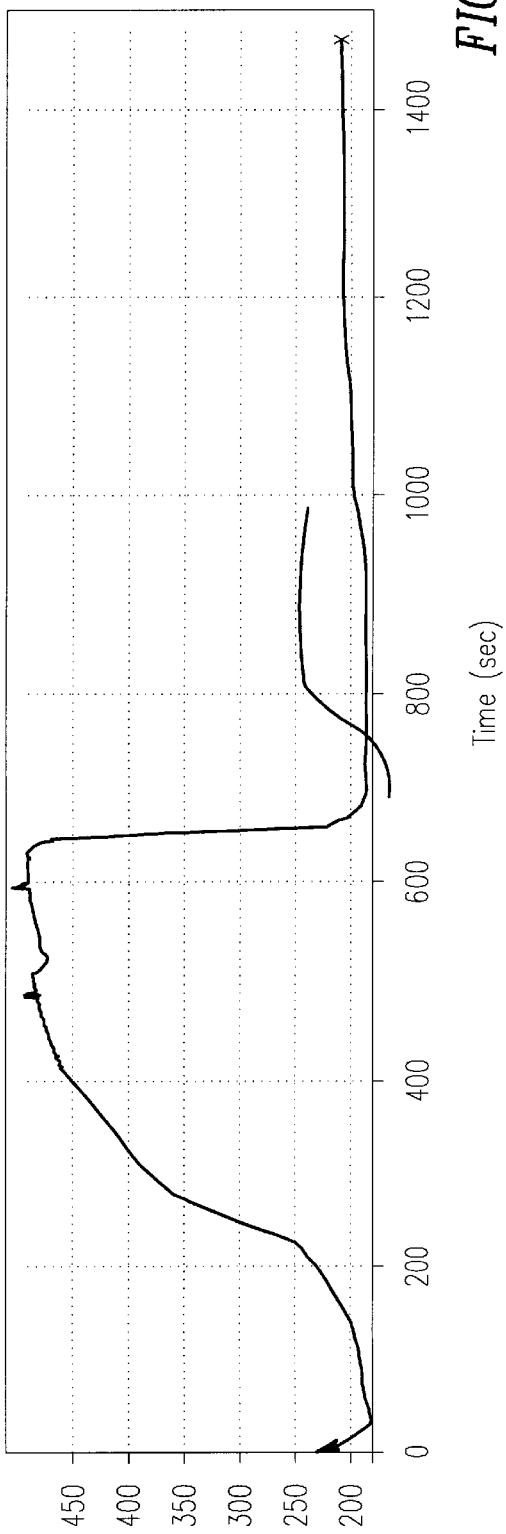
Figure 5B:
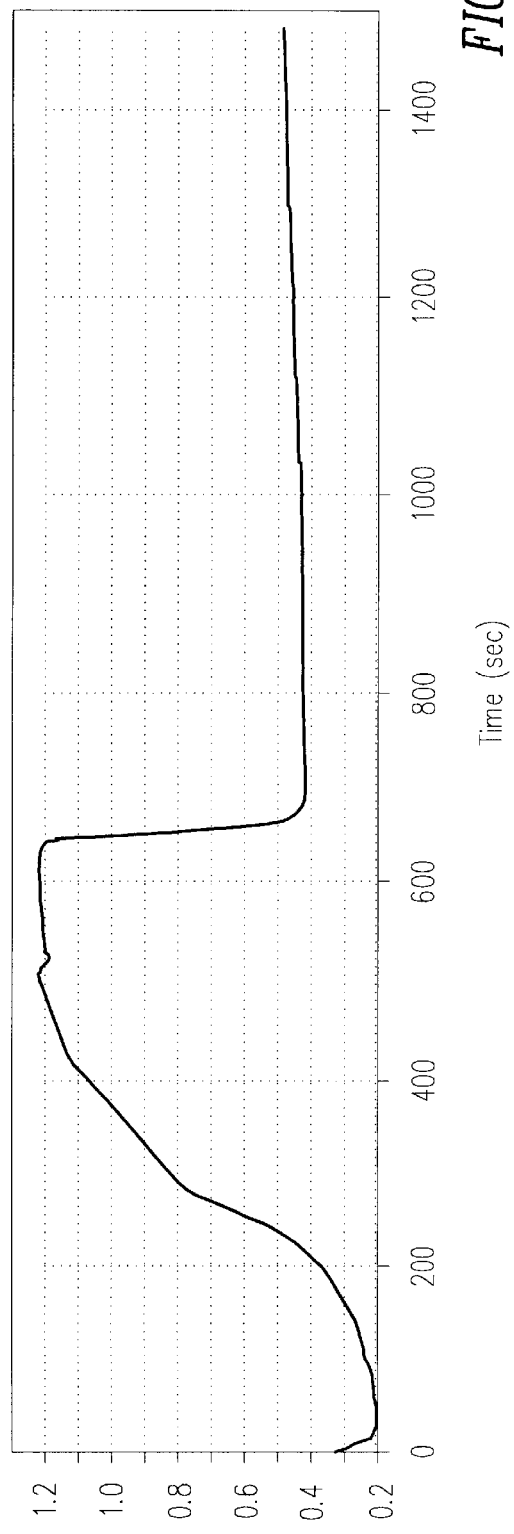

In Test #2, illustrated in FIGS. 5A and 5B, a two-step clean process was used. FIG. 5A shows an OES scan at 704 nm, and FIG. 5B shows an OES scan at 686 nm. Again, the clean gas (NF$_3$) was introduced through the process gas injection tubes at a pressure of 1.5 Torr. In the first step, a high flow rate of clean gas (800 sccm) was applied. This cleaned most of the surfaces in about 500 seconds but did not clean the inside surfaces of the process gas injection tubes. In the second step, which began after 645 seconds, the flow rate of the NF$_3$ was reduced to 100 sccm. This was in recognition of the fact that the high flow rate of the clean gas through the process gas injection tubes prevents proper cleaning of the interior surfaces of those tubes.

In Test #2, the power supplied to the coil was a 13.56 MHz signal at 4 kW. The signal was applied to both terminals of the coil. This high frequency signal provided a substantially different voltage signal in the coil as compared with the low frequency signal used in Test #1. This, in conjunction with the second step of the test, led to an effective cleaning of all reaction chamber surfaces, including the insides of the process gas injection tubes. In addition, the high-frequency power provided improved plasma stability and uniformity. Also, the high-frequency (capacitive) power coupling occurred at a relatively low maximum voltage. This reduces the intensity of the plasma attack on the reaction chamber materials themselves. However, the overall clean rate of only 3400 A/min was mediocre.

Figure 6A:
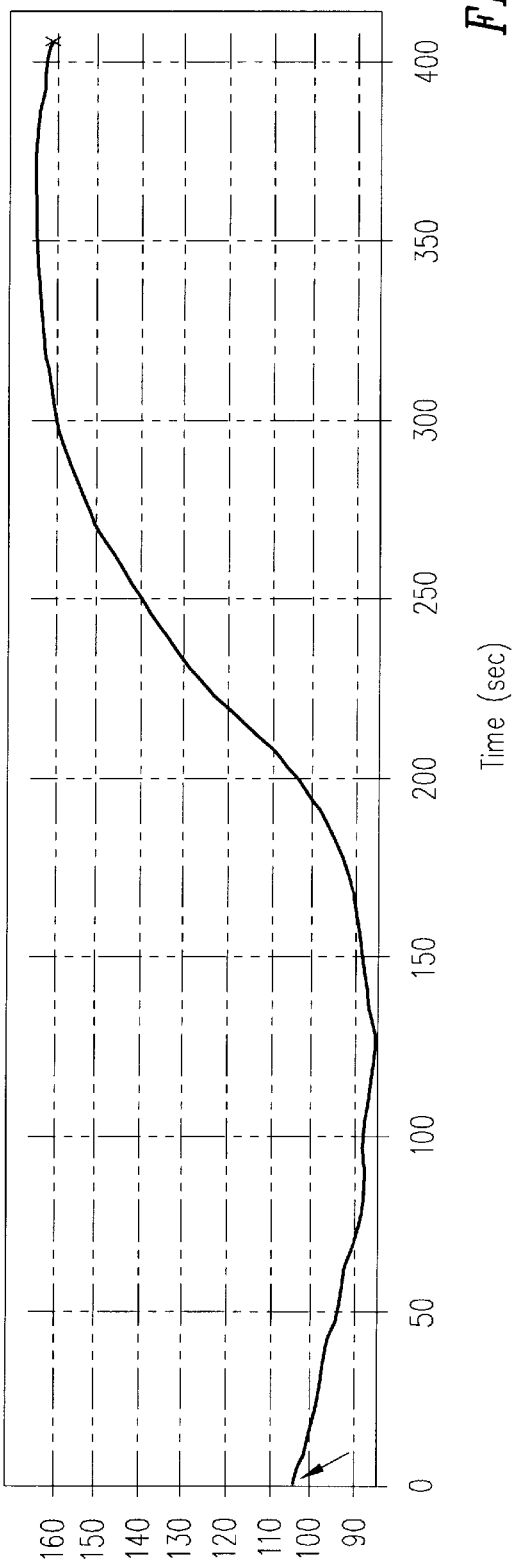
Figure 6B:
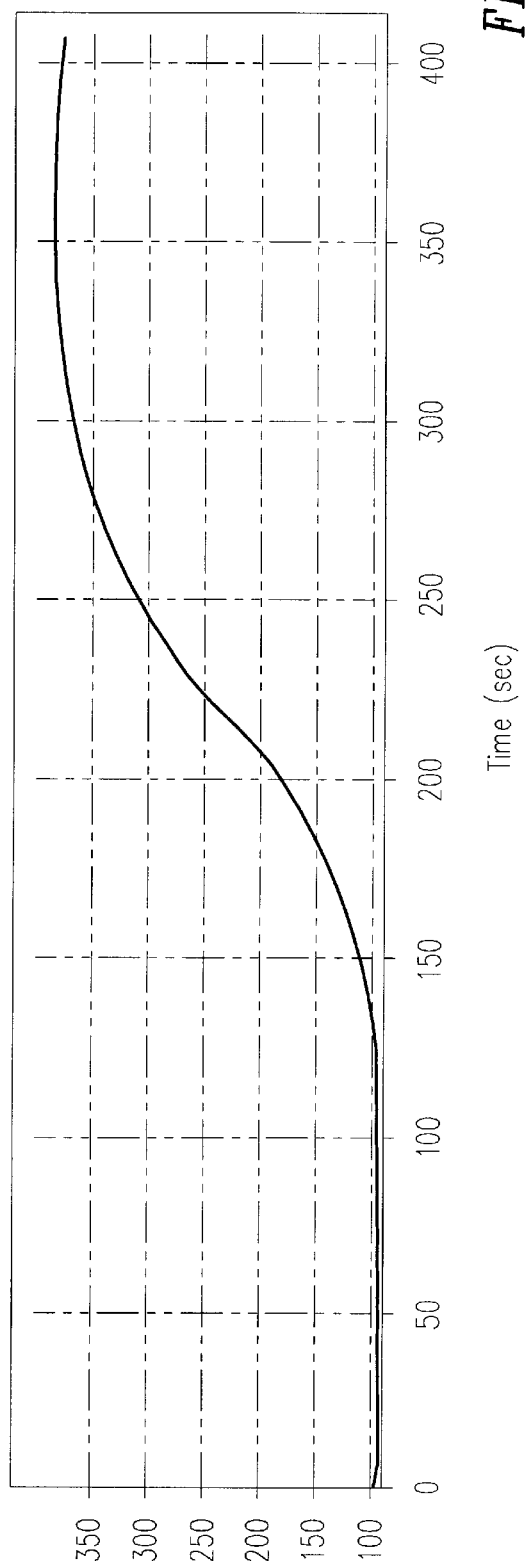

Test #3 is illustrated in the OES scans of FIGS. 6A and 6B, FIG. 6A being at a wavelength of 704 nm and FIG. 6B being at a wavelength of 686 nm. In Test #3, the clean gas was introduced through a separate clean gas injection tube, in accordance with this invention. The clean gas injection tube was located in a position where it received minimal deposition during processing yet delivered the clean gas (NF$_3$) to surfaces of the reaction chamber which receive substantial deposition. The flow rate of the clean gas was 1000 sccm at a pressure of 2 Torr. The power input to the coil was 13.56 MHz at 4 kW. The effective clean rate was 12000 A/min; all surfaces of the reaction chamber (including the process gas injection tubes) were effectively cleaned; and the stability and uniformity of the plasma were good. Other tests have shown that less advantageous positioning of the clean gas injection tube gives a lower effective rate of cleaning but still successfully cleans all surfaces of the reaction chamber.

The results of the tests are summarized in Table 1.

TABLE 1

|  | Effective Clean Rate (Å/Min) | All Surfaces Cleaned? | Plasma Stability and Uniformity |
| --- | --- | --- | --- |
| Test #1 | 8000 | no | poor |
| Test #2 | 2400 | yes | good |
| Test #3 | 12000 | yes | good |

While specific embodiments according to this invention have been described in this specification, it will be apparent to persons skilled in the art that numerous alternative embodiments may be constructed without departing from the broad principles of this invention. For example, while the embodiment described concerned a high-density-plasma chemical vapor deposition (HDP-CVD) process, this invention may also be used with other types of processes such as chemical vapor deposition (CVD) processes, plasma-enhanced chemical vapor deposition (PECVD) processes, and sputter-etching processes. While the process gas injection system described comprised tubes, other types of process gas injection systems, such as those which employ showerheads or ring injectors could also be used with this invention. This invention, as defined in the following claims, is intended to include all such alternative embodiments.

We claim:

1. A system for processing a substrate comprising a reaction chamber, said reaction chamber comprising:
   a chuck for supporting a substrate;
   a process gas injection system; and
   a clean gas injector separate from said process gas injection system, said clean gas injector being solely for injecting a clean gas for removing deposits from an interior surface of said chamber, said clean gas injector being oriented so as to direct a flow of a clean gas into a region within said chamber above said chuck.

2. The system of claim 1 wherein said clean gas injector is positioned such that an outlet of said injector is located laterally outside a periphery of a substrate supported on said chuck.

3. The system of claim 2 wherein said outlet of said clean gas injector is located near a plane defined by a surface of said substrate.

4. The system of claim 2 wherein said reaction chamber is at least partially enclosed by a vessel and said outlet of said clean gas injector is located at a distance of more than one centimeter from any surface of said vessel or said chuck.

5. The system of claim 1 wherein said clean gas injector comprises at least one tube.

6. The system of claim 1 wherein said clean gas injector comprises a metal tube and a ceramic sleeve for protecting said metal tube from a plasma within said chamber, said sleeve covering an end region of said metal tube.

7. The system of claim 1 wherein said process gas injection system comprises a plurality of process gas injection tubes.

8. The system of claim 7 wherein said process gas injection tubes are arrayed at equal intervals around a central axis of said chamber, said process gas injection tubes being oriented so as to direct a process gas towards said central axis.

9. The system of claim 8 wherein said process gas injection tubes are inclined upward towards a region within said chamber above said chuck.

10. The system of claim 1 wherein said reaction chamber is at least partially enclosed by a vessel having a generally hemispherical shape.

11. The system of claim 10 further comprising a coil, said coil being shaped in the form of a partial or complete hemisphere and being positioned adjacent an outside surface of said vessel.

12. The system of claim 11 further comprising a source of an AC signal, and lines for applying said AC signal to at least two points on said coil.

13. The system of claim 12 wherein said lines are connected to an upper terminal and a lower terminal of said coil.

14. A system for processing a substrate comprising:

a reaction chamber at least partially enclosed by a vessel;

a chuck for supporting a substrate within said reaction chamber;

a process gas injection system;

a coil positioned adjacent an outside surface of said vessel, said coil serving to generate a plasma within said reaction chamber;

a source of a first AC signal at a first frequency;

a source of a second AC signal at a second frequency;

lines for applying said AC signals to at least two points on said coil; and a plurality of switches connected in said lines, said switches collectively being operative in a first position to apply said first AC signal to said at least two points on said coil and said switches being operative in a second position to apply said second AC signal to one of said two points and to connect a second of said two points to ground.

15. The system of claim 14 wherein said switches in a first position being operative to apply said first AC signal to said at least two points on said coil are operative to apply said first AC signal to an upper terminal and a lower terminal of said coil.

16. The system of claim 1 wherein said interior surface of said chamber comprises an interior surface of said process gas injection system.

* * * * *